(12) United States Patent
Li et al.

(10) Patent No.: US 7,037,351 B2
(45) Date of Patent: May 2, 2006

(54) NON-POLYMERIC ORGANIC PARTICLES FOR CHEMICAL MECHANICAL PLANARIZATION

(75) Inventors: Yuzhuo Li, Potsdam, NY (US); Atanu Roy Chowdhury, Potsdam, NY (US); Kwok Tang, Mississauga (CA); Guomin Bian, Toronto (CA); Krishnayya Cheemalapati, Potsdam, NY (US)

(73) Assignee: Dynea Chemicals Oy, Helsinki (FI)

( * ) Notice: Subject to any disclaimer, the term of this patent is extended or adjusted under 35 U.S.C. 154(b) by 0 days.

(21) Appl. No.: 10/734,232

(22) Filed: Dec. 15, 2003

(65) Prior Publication Data

US 2005/0005525 A1    Jan. 13, 2005

Related U.S. Application Data

(60) Provisional application No. 60/485,492, filed on Jul. 9, 2003.

(51) Int. Cl.
*C09G 1/02* (2006.01)
*H01L 21/321* (2006.01)
*H01L 21/306* (2006.01)

(52) U.S. Cl. ............................ 51/298; 51/300; 51/307; 51/308; 51/309; 106/3; 438/692; 438/693

(58) Field of Classification Search .................. 51/307, 51/308, 309, 298; 106/3; 438/692, 693
See application file for complete search history.

(56) References Cited

U.S. PATENT DOCUMENTS

| | | | |
|---|---|---|---|
| 4,240,919 A * | 12/1980 | Chapman .................... | 510/369 |
| 4,599,186 A | 7/1986 | Choy et al. | |
| 4,959,113 A | 9/1990 | Roberts | |
| 5,084,071 A | 1/1992 | Nenadic et al. | |
| 5,114,437 A | 5/1992 | Takeuchi et al. | |
| 5,209,816 A | 5/1993 | Yu et al. | |
| 5,225,034 A | 7/1993 | Yu et al. | |
| 5,340,370 A | 8/1994 | Cadien et al. | |
| 5,366,542 A | 11/1994 | Yamada et al. | |
| 5,391,258 A | 2/1995 | Brancaleoni et al. | |
| 5,516,346 A | 5/1996 | Cadien et al. | |
| 5,527,423 A | 6/1996 | Neville et al. | |
| 6,171,352 B1 | 1/2001 | Lee et al. | |
| 6,248,143 B1 | 6/2001 | Masuda et al. | |
| 6,258,721 B1 | 7/2001 | Li et al. | |
| 6,576,554 B1 | 6/2003 | Matsui et al. | |
| 6,620,215 B1 | 9/2003 | Li et al. | |
| 2002/0016073 A1 | 2/2002 | Kondo et al. | |
| 2002/0095874 A1 | 7/2002 | Tsuchiya et al. | |
| 2004/0006924 A1 * | 1/2004 | Scott et al. .................... | 51/307 |
| 2004/0025444 A1 * | 2/2004 | Small et al. ................... | 51/307 |
| 2004/0173574 A1 * | 9/2004 | Grunwald ..................... | 216/83 |

FOREIGN PATENT DOCUMENTS

| | | |
|---|---|---|
| EP | 1 081 200 A1 | 3/2001 |
| EP | 1 138 733 A2 | 10/2001 |
| EP | 1 243 611 A1 | 9/2002 |
| JP | 07 018222 A | 1/1995 |
| JP | 10 183104 A | 7/1998 |
| JP | 2000 080351 A | 3/2000 |

* cited by examiner

*Primary Examiner*—Michael Marcheschi
(74) *Attorney, Agent, or Firm*—Birch, Stewart, Kolasch & Birch, LLP

(57) ABSTRACT

An abrasive composition comprising non-polymeric organic particles that is useful for chemical mechanical planarization (CMP), and which can widely be used in the semiconductor industry. The inventive compositions preferably comprise soft water in combination with 0.001–20 w/w % of non-polymeric organic particles, 0.1–10 w/w % of an oxidizing agent, 0.05–10 w/w % of a chelating agent, 0.01–10 w/w % of a surfactant, and 0–10 w/w % of a passivation agent at a pH in the range of 2–12, wherein said percentages are w/w (weight/weight) percentages, based on the total weight of said compositions. The abrasive compositions provide an efficient polishing rate, excellent selectivity and good surface quality when utilized as a new abrasive composition in CMP applications.

19 Claims, No Drawings

NON-POLYMERIC ORGANIC PARTICLES FOR CHEMICAL MECHANICAL PLANARIZATION

This non-provisional application claims priority under 35 U.S.C. § 119(e) to U.S. Provisional Application No(s). 60/485,492 filed on Jul. 9, 2003, the entire contents of which are hereby incorporated by reference.

FIELD OF THE INVENTION

The present invention relates to an abrasive composition for chemical mechanical planarization (CMP), which contains non-polymeric organic particles as abrasive materials. The invention also pertains to methods of preparing non-polymeric organic particles, methods of making abrasive compositions, which can be used in CMP applications, and CMP methods utilizing the same.

BACKGROUND OF THE INVENTION

CMP is a commonly used technology in the semiconductor industry. The pure substrate surface and complex surface of semiconductor wafer, dielectric layer, conducting wire and barrier materials in the integrated circuits have to be polished to achieve a certain degree of planarity, which is extremely important to reach a high density of integrated circuits. In general, CMP technology consists of four major specific technologies including slurry, pad, polisher and post-cleaning device. The CMP slurry provides a chemical environment to wet and adjust the interaction between abrasive, pad and the wafer surface, and also moderates the mechanical force on the polishing surface. The slurry plays a key role in CMP process and determines the production efficiency and product quality.

The present invention relates generally to the preparation of semiconductor devices and more particularly to improved slurry compositions for the chemical-mechanical planarization (CMP) of metal (e.g., Cu) layers and barrier materials (e.g., Ta, TaN, etc.) and dielectric materials for their polishing.

A semiconductor wafer typically includes a substrate, such as a silicon wafer, on which a plurality of integrated circuits have been formed. In the manufacture of integrated circuits, wafer surface planarity and quality is of extreme importance. In order to achieve the degree of planarity required to produce ultra high density integrated circuits, CMP processes are being employed.

In general, CMP involves pressing a semiconductor wafer against a moving polishing surface that is wetted with a chemically reactive, abrasive slurry. Conventional slurries either are acidic or basic, and generally contain alumina, silica, zirconium oxide, magnesium oxide, or cerium oxide abrasive particles. The polishing surface usually is a planar pad made of a relatively soft, porous material, such as polyurethane. The pad usually is mounted on a planar platen. Continuous pad devices also are being tested. Systems devoid of a slurry where the pad contains the abrasive also are being used.

Integrated circuits are chemically and physically integrated into a substrate by patterning regions in the substrate and layers on the substrate. The layers generally are formed of various materials having either a conductive, insulating, or semiconducting nature. Also, barrier materials or barriers are used to prevent the migration of ions and adhesion promoters. In order for a device to have high yields, it is crucial to start with a flat semiconductor wafer. If the surface is not uniform (e.g., areas of unequal elevation or surface imperfections), various problems can occur which may result in a large number of inoperable devices. Further details can be found in the following references: Luo, et al., "Chemical-Mechanical Polishing of Copper: A Comparative Analysis," February 13–14 CMP-MIC Conference, 1997 ISMIC—200:197/0083; Babu, et al., "Some Fundamental and Technological Aspects of Chemical-Mechanical Polishing of Copper Films: A Brief Review," Feb. 19–20, 1998 CMP-MIC Conference, 1998 IMIC—300P98/0385; Tseng, et al., "Effects of mechanical characteristics on the chemical-mechanical polishing of dielectric thin films," Thin Solid Films, 290–291 (1996) 458–463; Nanz, et al., "Modeling of Chemical-Mechanical Polishing: A Review," IEEE Transactions on Semiconductor Manufacturing, Vol. 8, No. 4, November 1995; Stiegerwald, et al., "Pattern Geometry Effects in the Chemical-Mechanical Polishing of Inlaid Copper Structures,": "J. Electrom. Soc., Vol 141, Oct. 10, 1994; Fury, "Emerging developments in CMP for semiconductor planarization—Part 2," Solid State Technology, 81–88, July 1995; Fury, "CMP Standards: A Frustration Cure," Semiconductor International, November 1995.

Surface planarity is of paramount importance in microelectronics. With the integrated technology approaching the era of Ultra Large Scale Integration (ULSI), CMP is touted as the only viable technique to meet today's planarity requirements. Some of the most important issues in CMP today include dishing and erosion, corrosion, defects of the surface, the control of polishing rate and selectivity among different materials on the surface. The prior art attempts to accomplish these goals as follows.

U.S. Pat. No. 4,959,113 discloses a method of polishing metal surfaces with aqueous slurries. The slurry composition comprises water, abrasive such as $SiO_2$, $Al_2O_3$, $TiO_2$, $ZrO_2$, $CeO_2$, $SnO_2$, SiC, TiC, and a salt containing any cation of group IIA, IIIA, IVA, or IVB and any anion of chloride, bromide, iodide, nitrate, sulfate phosphate, or perchlorate. The patent also discloses a pH range of 1–6 adjusted with mineral acids.

U.S. Pat. No. 5,084,071 discloses the CMP slurry, which comprises abrasive particles, e.g. $SiO_2$, $CeO_2$, $Fe_2O_3$, SiC, $Si_3N_4$, containing less than 1% (w/w) of alumina, a transition metal chelated salt (e.g. EDTA) as a polishing accelerator.

U.S. Pat. No. 5,114,437 discloses the CMP slurry for polishing aluminum substrate, which contains an alumina with an average particle size of 0.2–0.5 μm, and a polishing accelerator from the group consisting of chromium (Ill) nitrate, lanthanum nitrate, ammonium cerium (Ill) nitrate and neodymium nitrate.

U.S. Pat. No. 5,209,816 discloses a method for polishing Al- or Ti-containing metal layer with the CMP slurry, which contains inorganic abrasive materials, 0.1–20% by volume of $H_3PO_4$ and 1–30% by volume of $H_2O_2$.

U.S. Pat. No. 5,225,034 discloses the CMP slurry for polishing copper layer on a semiconductor wafer to produce copper wire on the wafer. The slurry comprises $AgNO_3$, inorganic abrasive particles and an oxidant selected from $H_2O_2$, HClO, KClO, $K_2MnO_4$, or $CH_3COOOH$.

U.S. Pat. No. 5,340,370 discloses the CMP slurry for polishing tungsten or tungsten nitride film, which comprises an oxidizing agent such as potassium ferricyanide, inorganic abrasive particles, water, and has a pH in 2–4.

U.S. Pat. No. 5,366,542 discloses a CMP slurry comprising alumina abrasive particles, chelating agent selected from the group consisting of polyaminocarboxylic acid (EDTA) and sodium or potassium salts, and further may contain beohmite or aluminum salt.

U.S. Pat. No. 5,391,258 discloses a CMP slurry for polishing silicon, silica or silicate composite. The slurry comprises, in addition to inorganic abrasive particles, hydrogen peroxide and potassium hydrogen phthalate.

U.S. Pat. No. 5,516,346 discloses CMP slurry for titanium film. The slurry contains potassium fluoride, inorganic abrasive particles such as silica, and pH<8.

U.S. Pat. No. 5,527,423 discloses the slurry for polishing a metal layer, which comprises an oxidizing agent such as iron nitrate, alumina particles containing at least 50% gamma phase, nonionic surfactants such as polyalkyl siloxanes, or polyoxyalkylene ethers.

U.S. Pat. No. 6,171,352 discloses a CMP slurry which contains, in addition to inorganic abrasive particles, an abrasion accelerator, wherein the abrasion accelerator comprises monocarboxy group- or an amino group-containing compound and optionally a nitrate salt, also a viscosity modifier such as polyacrylic acid or its copolymer.

U.S. Pat. No. 6,258,721 discloses an innovative CMP slurry of using diamond particles as an abrasive material, comprising ingredients such as an oxidizing agent, chelating agent, surfactant and others.

All of the above reported CMP slurries employ inorganic particles as abrasive materials and fail to adequately control dishing and erosion, corrosion, defects of the surface, polishing rate and selectivity among different materials on the surface.

Another approach to preparing CMP slurries is to use organic polymeric particles as the abrasive material. Such organic polymeric particle containing abrasive materials are disclosed in U.S. Pat. No. 6,620,215. Also, U.S. Pat. No. 6,576,554 teaches a slurry for CMP having a liquid and a plurality of polishing particles, wherein the polishing particle contains a composite particle formed by thermocompressing polymeric organic particles and inorganic particles. However, none of these patents teach or suggest the use of organic non-polymeric abrasive particles in the CMP slurries nor their unexpectedly superior properties.

SUMMARY OF THE INVENTION

The present invention provides novel CMP compositions and slurries that use organic abrasive particles therein. The invention further utilizes non-polymeric organic particles to control the interaction between particles and the wafer surface that offers unique properties for CMP applications that are not available with conventional inorganic abrasive particles.

The particles in a CMP slurry have at least three functions: serving as an abrasive to cut through the surface to-be-polished, as a carrier to deliver a desired ingredient and/or take away abraded materials from the surface that is being polished, and an agent that modifies the rheological behavior of the slurry. Typically, abrasive materials have been chosen based on relative hardness. Since it is commonly believed that the hardness of the abrasive particles must be high in order to achieve acceptable removal rates, the abrasive particles commonly used are polymeric inorganic particles or polymeric organic particles including silica, alumina, ceria, polystyrene, resin, etc. A review of the prior art shows that non-polymeric soft organic particles have not been considered as a potential key component in slurry formulation at all. The present invention is based on the discovery that these non-polymeric organic particles possess unexpectedly advantageous properties and value in CMP applications and in CMP performance.

One important advantage of using soft non-polymeric organic particles is the reduction in defects formed during CMP. Another advantage is that the soft non-polymeric organic particles have the ability to provide unsurpassed high selectivity in removal rate for copper over barrier and dielectric materials. And yet another unexpected benefit of a composition and slurry incorporating non-polymeric organic particles is that the non-polymeric organic particles are insensitive towards pressure for material removal rate (MRR). This is particularly valuable as today's CMP community faces tough challenges in reducing down-force without sacrificing removal rate. In addition, the abrasive particles can be significantly low in density, which leads to a much more stable composition and slurry for CMP applications.

When particles are soft in nature, their ability to act as an abrasive diminishes, i.e., the removal rate decreases. To compensate for this loss in removal rate, it is envisioned that the rheological behavior of the slurry can be modified. In other words, the composition of the slurry can be modified to increase the friction force thereby increasing the removal rate with little dependency on the down force.

For most CMP slurries, the MRR and down force follows a relationship described by the Preston equation:

$$MRR = C \times P + K$$

wherein MRR is the material removal rate, P is the down force or pressure, K is a chemical/mechanical modifier, and C is often referred as Preston Constant.

A Preston constant of greater than 1000 Å/psi is often encountered for most abrasive slurries. To reduce defects and avoid damages to low K dielectric materials, a low down force process is preferred. One of the challenges faced by CMP community today is how to retain the high MRR at low down force. For this reason, a CMP slurry that has a zero or small Preston constant is desirable. For a slurry that is formulated based on a non-polymeric organic particle, the rheological behavior can be very different from those using classic hard inorganic abrasive particles. As the organic particles may have very high deformation probability or elasticity, the Preston constant may be much smaller. In addition, as the removal mechanism for a slurry using non-polymeric particles is mainly controlled by friction force alteration or chemical interaction between the particle and the surface to be polished, there is a surprising reduction in down force.

DETAILED DESCRIPTION OF THE INVENTION

An embodiment of the present invention is a chemical mechanical planarization abrasive composition, which comprises non-polymeric organic particles as an abrasive material and a solvent in the form of a slurry.

In an embodiment of the present invention, the non-polymeric organic abrasive particle has an average particle size of less than 1 μm. Preferably, the average particle size is 0.05–0.75 μm. Most preferably, the average particle size is 0.2–0.5 μm. The particles can be reduced in size by various techniques, such as wet grinding, with or without the use of dispersants. The technical advantage to using small particle sizes are less scratches, and more contact area so that the end result is a more efficient polishing and better surface quality.

In an embodiment of the present invention, the particle size of the non-polymeric organic abrasive particles has a narrow size distribution. Preferably, the size distribution is less than ±75%. More preferably, the size distribution is less than ±60%. Most preferably, the size distribution is less than +50%. The advantages for having a narrow particle size distribution are two fold. One is that a narrow particle size distribution can be directly correlated to a low over sized particle count. Over sized (>1 µm) particles have been linked to various surface defects such as scratches, pull out, and delamination. The other advantage for a narrow particle size distribution is the performance consistency. More specifically, the CMP performance can be more directly and consistently correlated to the particle size and other physical properties.

The chemical structure of the non-polymeric organic abrasive particles is chosen to provide enough intermolecular forces such as hydrogen bonding to hold the particle essentially structurally intact, and to have sufficient surface functional groups that can interact with the surface to be polished. In modifying the chemical structure of the compounds used in the non-polymeric organic abrasive particles, the particles can be tailored to selectively remove one type of material over another type of material on the surface of the substrate. The type of compound used in the organic abrasive particles that is preferred has at least one of amine and amido functionalities. Most preferably, the compound is at least one selected from the group consisting of melamine, melamine derivatives such as acetoguanamine, benzoguanamine, dicyandiamide and salts thereof. Herein the term "non-polymeric" means that the compound does not contain units which are covalently linked. Preferably the molecular weight of the non-polymeric compound is less than 1000 g/mole. Most preferably, the molecular weight of the non-polymeric compound is 75–250 g/mole.

For example, for copper CMP, melamine and its derivatives are excellent examples. The strong hydrogen bonding among the molecules hold the particles together to form well defined particles. The amino functionality on the surface provides strong interaction with copper oxide and copper ions. The structural variation of melamine, and melamine derivates can fine-tune such intermolecular interactions and hence the performance of the slurry.

The present invention discloses methods of preparing such non-polymeric particles in compositions and slurries for CMP applications. The invention also discloses the advantages of using such non-polymeric organic particles in the present inventive compositions, slurries, methods and processes.

The non-polymeric organic particles "consist essentially of" the compound(s) (such as melamine). Herein the phrase "consist essentially of" means that the non-polymeric organic particles are greater than 80 w/w % pure in composition. The solid particles may contain impurities such as solvent groups crystallized as part of the lattice. Preferably, the non-polymeric organic particles have a greater than 90 w/w % purity. Most preferably, the non-polymeric organic particles have a greater than 95 w/w % purity. The w/w % values are based on the total weight of the particles.

The size and size distribution of the non-polymeric organic particles can be controlled using grinding techniques which are standard in the industry. The grinding may be performed under wet or dry conditions. In performing a wet grinding, it is preferable to use a dispersing agent/surfactant.

Any of nonionic, anionic, cationic and amphoteric dispersing agents/surfactants can be used. Examples of anionic dispersing agents/surfactants are fatty acid salts such as sodium stearate, sodium oleate and sodium laurate; alkylarylsulfonic acid salts such as sodium dodecylbenzenesulfonate; alkyl or alkenyl sulfate ester salts such as sodium lauryl sulfate; alkyl sulfosuccinate ester salts such as sodium monooctyl sulfosuccinate, sodium dioctyl sulfosuccinate (CYTEC OT-75) and sodium polyoxyethylenelauryl sulfosuccinate; sodium salt of special aromatic sulfonic acid-formalin condensate such as the sodium salt of a condensation product of beta-naphthalene sulfonic acid with formaldehyde (DAXAD 19); polyoxyalkylene alkyl or alkenyl ether sulfate ester salts such as sodium polyoxyethylene lauryl ether sulfate; polyoxyalkylene alkylaryl ether sulfate ester salts such as sodium polyoxyethylene nonylphenol ether sulfate; etc.

Further, examples of usable nonionic dispersing agents/surfactants are polyoxyalkylene alkyl or alkenyl ethers such as polyoxyethylene lauryl ether and polyoxyethylene stearyl ether; polyoxyalkylene alkyl aryl ethers such as polyoxyethylene octylphenol ether and polyoxyethylene nonylphenol ether; sorbitan fatty acid esters such as sorbitan monolaurate, sorbitan monostearate and sorbitan trioleate; polyoxyalkylene sorbitan fatty acid esters such as polyoxyethylene sorbitan monolaurate; polyoxyalkylene fatty acid esters such as polyoxyl ethylene monolaurate and polyoxyethylene monostearate; glycerol fatty acid esters such as oleic acid monoglyceride and stearic acid monoglyceride; polyoxyethylene polyoxyproylene block copolymer; etc.

Further, as usable cationic dispersing agents/surfactants, there can be mentioned alkylamine salts such as, for example, laurylamine acetate; quaternary ammonium salts such as, for example, lauryl trimethylammonium chloride and alkylbenzyldimethylammonium chloride; polyoxyethylalkylamine; etc. As amphoteric surfactants, there can for example, be mentioned alkyl betaines such as laurylbetaine, etc.

Among these dispersing agents/surfactants, it is most preferable to use a saturated or unsaturated dialkyl ester sulfosuccinate such as sodium dioctyl sulfosuccinate or a sodium salt of a condensation product of beta-naphthalene sulfonic acid with formaldehyde.

Another method of controlling the size and size distribution of the non-polymeric organic particles is using hydrodynamic cavitation as described in U.S. Pat. No. 5,931,771 to Kozyuk (and the references cited therein). This technique is based on the controlled collapse of vapor bubbles so that the shock waves cause particles to collide and break down.

In an embodiment of the invention, the slurry may further comprise at least one of a surfactant, an oxidizing agent, a chelating agent and a passivation agent.

In an embodiment of the invention, the slurry has 0.001–20 w/w % of non-polymeric organic particles. Preferably, the slurry has 0.005–15 w/w % of non-polymeric organic particles. Most preferably, the slurry has 0.01–10 w/w % of non-polymeric organic particles. The w/w % values are based on the total weight of the slurry.

The solvent used in the slurry is preferably "soft" water. The term "soft" as used herein means that the water has less than 500 ppm heavy metal impurities. Preferably, the soft water has less than 50 ppm heavy metal impurities. Salts and other impurities that do not significantly affect the polishing process of the abrasive slurry, do not necessarily need to be removed from the water prior to its use.

When the surfactant is used, it is generally added in a concentration of 0.05–10 w/w % based on the weight of the slurry composition. Preferably the surfactant is added in a concentration of 0.05–3 w/w %. More preferably, the concentration is 0.05–1 w/w %. The surfactant can be either ionic or non-ionic, however, a non-ionic surfactant is preferred. Any non-ionic surfactant known in the art can be used. Examples of surfactants which can be used include alkylated polyethylene oxide, alkylated cellulose, alkylated polyvinyl alcohol, alkyl or aryl carboxylic acid, sulfate or ammonium salt and polystearic ether.

The oxidizing agent used in the inventive abrasive composition, can be any suitable commercial oxidant, such as peroxides, chlorates, chlorites, perchlorates, bromates, bromites, perbromate, nitrates, persulfates, iodates, permanganates, chromates and hypochlorites or any mixture thereof. Examples include $H_2O_2$, $ClO_3$, $FeNO_3)_3$, $K_2S_2O_8$ $KlO_3$, $K_2MnO_4$, and $CH_3COOOH$. The concentration of the oxidizing agent depends upon the strength of the oxidizing agent. When the oxidizing agent is used, it is added to the slurry in a concentration of 0.01–10 w/w % based on the weight of the slurry composition. Preferably, the concentration is 0.05–10 w/w %. Most preferably, the concentration is 0.1–5 w/w %.

It is highly desirable to improve the selectivity of metal planarization as much as possible. Further improvements in CMP planarization of dielectric/metal composite structures can be obtained by the addition of a chelating agent to the slurry which is selective for the metal component of interest. This results in a further increase in the corrosion rate of the metal phase and increased selectivity of metal versus dielectric phase removal, making the planarization process much more efficient.

The chelating agent to be used in the present invention is a compound which has a multidentate ligand to form a chelate compound with a metal ion. A water soluble chelating agent is generally used in the present invention, and is preferably a polyamine, polyaminocarboxylic acid and/or an amino acid. The most preferred being an amino acid. Examples of the polyamine include ethylenediamine, 2,2'-bipyridine, and diethylenetriamine. Examples of the polyaminocarboxylic acid include nitrilotriacetic acid, ethylenediamine-tetraacetic acid, and diethylenetriaminepentaacetic acid, and sodium or potassium salts thereof. Glycine is an example of an amino acid chelating agent.

When the chelating agent is used, it is added in an amount of 0.05–10 w/w % based on the weight of the slurry composition. Preferably the concentration is 0.1–7 w/w %. Most preferably, the concentration is 0.1–5 w/w %. With an excessively small amount, the chelating agent does not produce the intended effect of the invention; and with an excessively large amount, the chelating agent is wasteful without any additional effect.

The CMP slurry may further comprise a passivating agent. When the passivating agent is used, it is generally added in the range of 0.0001–10 w/w % based on the weight of the slurry composition. Preferably, the passivation agent is in a concentration of 0.001–5 w/w %. Most preferably, the concentration is 0.001–1 w/w %. The purpose of the passivating agent is to control the etch rate of at least one of the features. For the etching of copper, an effective passivating agent is a phosphate. The phosphate may be, for example, dilute phosphoric acid or ammonium phosphate which is added in an effective amount sufficient for passivation. The passivation agent can also be an organic compound containing two or more hetero-elements such as nitrogen, sulfur, phosphorus, and oxygen.

In general, all benzotriazole (BTA) or benzothiazole compounds can be used as copper film passivating agents. Some representative examples include, but are not limited to 1H-benzotriazoleacetonitrile, benzotriazole-5-carboxylic acid, 2(3H)-benzothiazolone, and 1H-benzotriazole-1-methanol.

The CMP slurry may also contain inorganic abrasive particles. Generally, the inorganic abrasive particles are added in a concentration of 0.1–10 w/w % based on the weight of the slurry composition. Preferably, the concentration is 0.5–5 w/w %. More preferably, the concentration is 0.5–2 w/w %. The abrasive agent can be formed of any inorganic particles, as long as the hardness is in a range of 1,200 to 10,000 kg/mm$^2$ (as measured by atomic force microscopy). The inorganic abrasive agent includes at least one of $SiO_2$, $Al_2O_3$, $ZrO_2$, $CeO_2$, $SiC$, $Fe_2O_3$, $TiO_2$, $Si_3N_4$ and diamond.

The CMP slurry may further comprise polymeric abrasive particles. These polymers are prepared from a conventional process such as that described in U.S. Pat. Nos. 6,620,215, 6,245,853 and 6,576,554 which are herein incorporated by reference in their entirety. The polymeric abrasive particles can be added in a concentration of 0.1–20 w/w % based on the weight of the slurry composition. Preferably, the polymeric abrasive particles are added in a concentration of 1–15 w/w %. More preferably, the concentration is 1–5 w/w %. The organic resin particles have an average particle size in a range of 0.05–5 microns. Preferably the average particle size is 0.05–1 micron. Most preferably, the average particle size in a range of 0.1–0.5 micron.

The hydrogen ion concentration of the CMP slurry is pH 1–13, preferably 2–12, and most preferably 4–10. The pH is adjusted with an acid or base. Acids include any mineral acids such as sulfuric acid, hydrochloric acid, and nitric acid, or organic acids such as acetic acid. The base is an alkaline earth metal hydroxide, ammonia or an organic amine. The pH can also be maintained by adding a buffer solution.

The polishing composition of the present invention may be incorporated with the following known additives depending upon the type of object to be polished or upon the conditions for the polishing operation.

Examples of the additives include water-soluble alcohols such as ethanol, propanol, and ethylene glycol; organic polyanionic substances such as lignin sulfonate, carboxymethylcellulose salt, and polyacrylate; celluloses such as cellulose, carboxymethyl cellulose, and hydroxyethyl cellulose; and inorganic salts such as ammonium sulfate, ammonium chloride, ammonium acetate and magnesium nitrate.

The polishing composition of the present invention may be produced as a stock of high concentration which is diluted at the time of use. The above-mentioned concentration is applied to the polishing composition ready to use.

The polishing composition of the present invention is used for the polishing of metal, glass, and plastics. It is particularly suitable for the polishing of metal films because of its ability to provide a defect-free polished surface.

Depending upon the complexity of the substrate to be polished, it is possible to use a first slurry which selectively removes one component from the substrate, and then use a second slurry which has been tailored to remove a second component from the substrate. Typically, after each polishing stage, there is a cleaning stage.

The technique of CMP planarization and cleaning operations are practiced in conventional fashion, such as can been found in the literature. In this regard, the following references are representative: "CMP Grows in Sophistication", Semiconductor International, November 1998 Cover Story, Ruth Dejule, Associate Editor; Sethuraman, "CMP—Past, Present and Future", Future Fab, Issue 5 (Mar. 10, 1999);

and "Slurries and Pads Face 2001 Challenges", Semiconductor International, Alexander E. Braun, Associate Editor, November 1998.

Unless otherwise noted herein all %'s refer to weight/weight (w/w) percentages, and in the case of compositions and slurries of the instant invention they refer to w/w %'s based on the total weight of the compositions and slurries.

The following examples are provided in order to illustrate certain preferred embodiments of the instant invention. Accordingly, the following examples are not to be construed as being limiting to the instant invention as more broadly set forth herein or the equivalents thereof which are known and understood by those of ordinary skill in the art and which are readily apparent to the same.

EXAMPLES

Testing Methods

Slurry Preparation Using Potassium Persulfate (KPS System)

To prepare a primary aqueous slurry, a designated amount of melamine particles is first dispersed in deionized (DI) water containing pre-determined amount of polystearyl ether (surfactant) and with the assistance of sonication to obtain an uniform dispersion. The slurry container is then placed on a magnetic stirrer plate and stirred for 10 minutes at 75% maximum speed. Sonication is then applied for an additional 25 minutes. The slurry container then is placed back on the magnetic stirrer and stirred at 75% maximum speed for 2 minutes. Formulated amount of other ingredients, such as glycine and potassium persulfate, are added into the slurry during stirring. The slurry pH is adjusted by using potassium hydroxide solution for the desired range.

A typical primary slurry is formulated with the following composition: 0.1–11 potassium persulfate w/w %, 0.1–1 w/w % glycine, 0.1–2 w/w % melamine, 0.1 w/w % surfactant, and deionized (DI) water.

Slurry Preparation Using Peroxide ($H_2O_2$ System)

To prepare a primary aqueous slurry, a designated amount of glycine and BTA are first dispersed in deionized (DI) water. The slurry container is then placed on a magnetic stirrer plate and stirred for 10 minutes at 75% maximum speed. The amount of melamine particles required according to the formulation is then added into the solution continuing the process of stirring. Finally the required amount of $H_2O_2$ is added into the system after-which the pH is adjusted to 5.00 with conc. HCl.

A typical primary slurry is formulated with the following composition: 0.1–1 glycine w/w %, 1–5 mM BTA, 1–5% melamine and DI water.

Disc Polishing

A disc of 1" diameter by 0.25" thickness purchased from Kamis Inc, is mounted onto a single side polishing machine (Struers Labopol 5 Grinding Table, Serial # 5200825 and Struers LaboForce 3 Force Arm, Serial #5210461, manufactured by Struers Inc, Westlake, Ohio) which has a soft polyurethane polishing pad mounted onto its lower side. Polishing is conducted for three minutes using a pressure of 6 psi with a slurry flow rate of 60 ml/minute. The disk and the pad have a relative rotating speed of 150 rpm. After polishing, the disk is removed from the polisher and ultrasonic cleaning is performed to clean the polished surface of the disk. The weight loss of the disk is measured and the average material removal rate (MRR) is calculated.

Static Etching Experiment

Three 1" diameter by 0.25 thickness copper discs, which were purchased from Kamis Inc, are put inside a glass beaker and the beaker is placed on a magnetic stir plate. After that 300 ml of slurry is poured into the beaker, which contains three copper discs, and it is continuously stirred for five minutes at 75% of maximum speed and elapsed time is monitored by an electronic stopwatch. After five minutes, all the three discs are removed from the beaker and cleaned by using an ultrasonic cleaning method. Then weight loss of the discs is measured by an electronic weighing balance and the average static etching rate (SER) is calculated.

Wafer Polishing

Polishing of 8" blanket wafer: Eight inch blanket wafers (from Montco) are polished on Westech 372M under the following polishing conditions; Down Force (4 psi), slurry flow rate (200 ml/min), platen speed and carrier speed (75/65 rpm being the maximum, respectively). Removal rate is calculated by measuring resistivity at different points on wafer surface (then convert resistivity to thickness) before and after polishing. After polishing surface quality is evaluated by using a Horizon Non-contact optical profilometer.

Polishing 8" patterned wafer Eight-inch patterned wafers (SeMaTech 854) are polished with Westech 372-M. The polishing conditions are as follows: wafer pressure (4 Psi); slurry flow rate (200 ml/min); platen speed and carrier speed (75/65 rpm being the maximum, respectively). After polishing, the dishing and erosion are measured using a high-resolution stylus profilometer, Ambios XP-2. The surface quality of the copper, tantalum and oxide wafer is evaluated using a Horizon Non-contact optical profilometer. The scanning size is 268800×268800 nm.

Example-1

Melamine particles were reduced in size to less than one micron by various techniques, such as wet grinding, with and without the use of dispersants. The following table shows different samples, with corresponding process conditions:

| Sample | Composition | Wt. of Solids, (g) | Total Wt., (g) | % Solid |
|---|---|---|---|---|
| (X) | Melamine[a] + Deionized Water | 748 | 4317 | 17.34 |
| (Y) | Melamine[a] + Deionized Water + 1.54 g Dispersant A[b] | 770 | 4441 | 17.34 |
| (Z) | Melamine[a] + Deionized Water + 7.82 g Dispersant B[c] | 780 | 4503 | 17.34 |

[a]The melamine was reduced in particle size using hydrodynamic cavitation
[b]Dispersant A is a sulfosuccinate ester salt
[c]Dispersant B is a sodium salt of aromatic sulfonic acid-formalin condensate The prepared organic particles have an average particle size less than 500 nm and narrow particle size distribution. It is also determined that there is a minimal number of particles that are significantly larger than 1000 nm. The prepared aqueous slurry is stable against settling and oxidization. They are easily diluted and mixed with other required CMP ingredients under moderate mixing conditions.

Example-2

As shown in the following table, the copper material removal rate (MRR) for a comparative solution having no non-polymeric organic particles and containing deionized water, the oxidizing agent potassium persulfate (KPS), the complexing agent glycine and the surfactant polystearic ether (PSE) at pH=8 is moderate and the static etch rate (SER) is relatively small. The copper material removal rate was significantly enhanced when a small amount of melamine particles was added. It was found that the material removal rate decreases slightly when melamine solid content was significantly greater than 0.1%.

TABLE 1

Effect Of Sample (Y) On Copper Removal Rate.

|  | Melamine % (w/w)[a] | | | | |
| --- | --- | --- | --- | --- | --- |
|  | 0.0 | 0.05 | 0.1 | 0.3 | 0.5 |
| MRR (Å/min)[b] | 2628 | 6428 | 8602 | 7465 | 6896 |
| SER (Å/min)[b] | 165 | 422 | 600 | 312 | 283 |

[a]Other components of slurry: 0.3% KPS; 0.2% Glycine; 0.1% PSE; deionized water; pH = 8.00
[b]Polishing was performed using a Struers Labopol 5 Grinding Table The trends in the data of Table 1 are believed to result from the following interactions. As the amino functional group on the surface of the melamine particles may have a strong interaction with the copper oxide surface and increase the friction force, the initial material removal rate increase can be directly related to the friction increase. Further addition of melamine particles may serve as a lubricant and decrease the friction. The material removal rate decreases as a consequence for such a rheological modification. Another explanation for the MRR trend may also be related to the interaction between the oxidizing agent and the particle surface. It is known that an amino group can cause the decomposition of KPS and lead to a more reactive species, which significantly increases the MRR. As the surface of the melamine particles is rich in amino functional groups, the addition of melamine particles provides such interaction. When excessive amounts of melamine particles are added, they provide greater surface area for KPS to adsorb, which may lead to a decrease in effective KPS concentration and a decrease in overall MRR.

Example-3

As shown in Table 2, when copper polishing was conducted using melamine-based slurry at various down forces, the material removal rate changes very little. By applying the Preston equation to the data set, the Preston constant is only about 300 Å/psi, which is less than ⅓ of what would be expected for a classic abrasive slurry. The potential advantages of using such a slurry for copper/low k process integration are tremendous.

TABLE 2

Effect Of Pressure On Copper Removal Rate For A Representative KPS Formulation Using Sample (Z).

|  | Pressure (psi) | | | |
| --- | --- | --- | --- | --- |
|  | 1.5 | 2.5 | 3.5 | 5 |
| MRR (Å/min)[b] | 4130 | 4490 | 4650 | 5280 |

Slurry: 2% melamine; 0.9% KPS; 0.75% Glycine; 0.1% PSE; deionized water; pH = 8.00. Polisher: 372 M. Wafer Type: 8" Copper blanket wafer. The melamine was reduced in particle size using hydrodynamic cavitation.

Example-4

As shown in Table 3, the low dependency on polishing down forces for copper material removal rate is also true for a hydrogen peroxide based slurry. The Preston constant, if applied, is even smaller than that obtained for a typical KPS system. As mentioned earlier, this unexpected property for a slurry based on non-polymeric particles is truly remarkable and very useful for copper/low k integration.

TABLE 3

Effect Of Pressure On Copper Removal Rate For A Representative Hydrogen Peroxide Formulation.

|  | Pressure (psi) | | |
| --- | --- | --- | --- |
|  | 2 | 3 | 4 |
| MRR (Å/min) | 6830 | 8330 | 8460 |

Slurry: 5% melamine; 5% $H_2O_2$; 1.0% Glycine; 1 mM BTA; deionized water; pH = 5.00. Polisher: 372 M. Wafer Type: 8" Copper blanket wafer. The melamine was reduced in size by mechanical milling.

Example-5

Another important characteristic for CMP slurries that employ soft non-polymeric organic particles is its high chemical selectivity for different surfaces to be polished. More specifically, when formulated properly, a high selectivity can be obtained in material removal rate for copper over barrier (Ta, TaN, etc), dielectric (oxide, low k, etc.), and capping materials for low k dielectrics (SiCN, SiC, etc). As shown in Table 4, the MRR selectivity for slurry that contains melamine particles is extremely high.

TABLE 4

MRR Selectivity Of Copper, Ta, Silicon Oxide, And SiC For Slurries Formulated Based On Melamine Particles.

|  | Materials | | | |
| --- | --- | --- | --- | --- |
|  | Cu | Ta | Silicon Oxide | SiC |
| MRR (A/min)* | 4130 | <5 | <10 | <10 |
| MRR (A/min)** | 6830 | <5 | <10 | <10 |

*Slurry: 2% melamine; 0.9% KPS; 0.75% Glycine; 0.1% PSE; deionized water; pH = 8.00. Polisher: 372 M. Wafer Type: 8" Copper blanket wafer. The particle size of the melamine was reduced by mechanical milling.
**Slurry: 5% melamine, 5% $H_2O_2$; 1.0% Glycine; 1 mM BTA; deionized water; pH = 5.00. Polisher: 372 M. Wafer Type: 8" Copper blanket wafer. The particle size of the melamine was reduced by mechanical milling.

Example-6

One of the most important performance characteristics of a copper CMP slurry is its ability to obtain low dishing values after the over plated/deposited copper has been completely cleared or removed and over-polished at least for an additional 20% of the polishing time. One of the commonly used patterned wafers in the copper CMP community is the SEMATECH 854 patterned wafer. To evaluate for dishing, one looks to the 50 um lines in 50% metal density arrays. The industry target for today's patterned layout and design is to obtain dishing values below 500 Å after extensive optimization on both slurry formulation and processing parameters on the polishers. The final dishing values can be heavily dependant upon the extensiveness of such optimization and the quality of the polishers. For a relatively under-optimized formulation and a set of polishing parameters using the polishers that are available to the inventors for this invention, 1000–1200 Å dishing values are considered to be excellent for the best abrasive slurries in comparison. As shown in Table 5, the dishing values are excellent at a pressure (4 psi) that is comparable to those used for classic slurries. In addition, the ability to obtain low dishing values and long over polishing window is often directly related to the so-called planarization efficiency. A good polishing slurry should have planarization efficiency above 90% for the initial step height reduction stage.

A "long over polishing window" means that even if the prescribed polishing time is exceeded, there is essentially no damage to the material beneath the copper. In other words, it has a more forgiving or wider operating window. "Step height reduction" refers to the relationship between the "global" surface area and a purposefully "depressed" area. A long "over polishing window" and good "step height reduction efficiency" are both favorable goals.

TABLE 5

Representative Patterned Wafer Polishing Results For A Slurry Based On Hydrogen Peroxide And Melamine Particles[a].

| Metrics | Results |
|---|---|
| Cu MRR (Å/min) | 6780 |
| Ta MRR (Å/min) | <5 |
| Planarization Efficiency (First 6000 Å MRR) | 100 |
| Dishing (50/50 μm lines) right after Cu clearing | 750 |
| Dishing (50/50 μm lines) after 20% over polishing | 1200 |

[a]Slurry formulation used: 5% melamine, 5% $H_2O_2$, 1% glycine, 1 mM BTA & pH = 5.00. The particle size of the melamine was reduced by mechanical milling.

Example-7

It is not uncommon to obtain superior polishing results when the polish is conducted at a lower down force. It is uncommon, however, to achieve such improvement with the same formulation and material removal rate. Table 6 shows that, with the use of melamine based slurry, one can achieve such an improvement in performance without sacrificing the material removal rate. This characteristic is particularly important for semiconductor manufacturing industry as it translates to better performance at the same throughput.

TABLE 6

Representative Patterned Wafer Polishing Results For A Slurry Based On Hydrogen Peroxide And Melamine Particles[a] At 2 Psi.

| Metrics | Results |
|---|---|
| Cu MRR (Å/min) | 6500 |
| Ta MRR (Å/min) | <5 |
| Planarization Efficiency (First 6000 Å MRR) | 100 |
| Dishing (50/50 um lines) right after Cu clearing | 500 |
| Dishing (50/50 um lines) after 20% over polishing | 750 |

[a]Slurry formulation used: 5% melamine, 5% $H_2O_2$, 1% glycine, 1 mM BTA & pH = 5.00. The particle size of the melamine was reduced by mechanical milling.

Example-8

It is expected that the results obtained and described in the previous examples can be obtained with organic particles that have the same or similar chemical/physical/mechanical characteristics in relation to melamine. Table 7 shows the results obtained with slurries that utilize organic particles that are melamine derivatives or analogs. It can be seen from the results that the invention can be extended to other similar organic materials. It should be transparent to those skilled in the art that further improvement upon the results obtained and described in the above examples can be made by using some of those analogs or derivatives as abrasive particles with careful consideration, extensive optimization, and structural design.

TABLE 7

Effect Of Acetoguanamine On Copper Removal Rate.

| | Acetoguanamine % (w/w)[a] | | | |
|---|---|---|---|---|
| | 0 | 0.1 | 0.3 | 0.5 |
| MRR (Å/min) | 675 | 3500 | 4675 | 5000 |
| SER (Å/min) | 69 | 348 | 396 | 397 |

[a]Other components of slurry: 0.3% KPS; 0.2% glycine; 0.1% PSE; DI water, pH = 8.00. Polisher: Struers Labopol 5 Grinding Table Disc: 1" Copper disc. The acetoguanamine was used in the powder form as purchased.

Example 9

Samples were prepared with the combination of non-polymeric organic abrasive particles and polymeric organic abrasive particles. The results in Table 8 show that slurries prepared with this combination of abrasive particles have high MRR's and high SER's. The ratio of MRR to SER is a measure of planarization efficiency.

TABLE 8

Effect Of Resin Abrasive Particles In The Slurry On The MRR And SER

| Slurry Composition | Resin (w/w %) | Ground Melamine[a] (w/w %) | MRR (Å/min) | SER (Å/min) | Ratio of MRR to SER |
|---|---|---|---|---|---|
| (i) | 1 | None | 401.8 | 41.4 | 9.71 |
| (i) | 1 | 0.2 | 655.1 | 131.2 | 5.00 |
| (i) | 1 | 0.4 | 654.5 | 124.3 | 5.3 |
| (i) | 1 | 0.6 | 638.3 | 139.1 | 4.6 |
| (ii) | None | 0.8 | 463.1 | 17.7 | 26.2 |
| (ii) | 1 | 0.8 | 364.1 | 10.9 | 33.4 |
| (ii) | 3 | 0.8 | 486.5 | 11.4 | 42.7 |
| (ii) | 5 | 0.8 | 482 | 18.1 | 26.6 |
| (iii) | 5 | None | 598.1 | 33.2 | 18.02 |
| (iii) | 5 | 0.1 | 750.1 | 34.3 | 21.09 |
| (iii) | 5 | 0.2 | 777.00 | 47.3 | 16.43 |

(i) - Slurries were prepared with a melamine-formaldehyde condensate resin and melamine in the amounts shown along with 3% hydrogen peroxide, 1% glycine, 1 mM BTA, deionized water, and 0.05% PSE.
(ii) - Slurries were prepared with a melamine-formaldehyde condensate resin and melamine in the amounts shown along with 0.3% potassium persulfate, 0.2% glycine, deionized water and 0.1% PSE at a pH of 8.00.
(iii) - Slurries were prepared with a melamine-formaldehyde condensate resin and melamine in the amounts shown along with 0.3% potassium persulfate, 0.75% glycine, deionized water and 0.1% PSE at a pH of 8.5.
[a]The melamine was mechanically ground without a dispersant.

Each publication cited and/or referred to hereinabove is incorporated herein by reference in its entirety.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A chemical mechanical planarization abrasive composition, which comprises non-polymeric organic particles in a concentration of 0.001–20 w/w % as an abrasive material, 0.1–10 w/w % of an oxidizing agent, 0.05–10 w/w % of a chelating agent, 0.01–10 w/w % of a surfactant, 0–10 w/w % of a passivation agent and soft water in the form of a slurry, wherein the non-polymeric organic particles have an average particle size of less than 1 μm.

2. The abrasive composition according to claim 1, wherein the non-polymeric organic particles consist essentially of at least one compound selected from the group consisting of melamine and a derivative thereof.

3. The abrasive composition according to claim 1, wherein the non-polymeric organic particles contain at least one functional group selected from the group consisting of amino, amido and metal salt thereof.

4. The abrasive composition according to claim 1, wherein essentially all of said particles have a size distribution between +75% and −75% of the average particle size.

5. The abrasive composition according to claim 1, wherein the slurry has a pH in the range of 2–12.

6. The abrasive composition according to claim 1, wherein the oxidizing agent is at least one selected from the group consisting of peroxide, chlorate, chlorite, perchlorate, bromate, bromite, perbromate, nitrate, persulfate, iodate, permanganate and hypochlorite.

7. The abrasive composition according to claim 1, wherein $H_2O_2$ is the oxidizing agent and is present in an amount of 0.1–6% w/w.

8. The abrasive composition according to claim 1, further comprising a complexing agent which is at least one selected from the group consisting of polyamine, polyaminocarboxylic acid and an amino acid.

9. The abrasive composition according to claim 8, wherein the complexing agent is an amino acid.

10. The abrasive composition according to claim 1, wherein the surfactant is a nonionic surfactant.

11. The abrasive composition according to claim 1, wherein the surfactant is at least one selected from the group consisting of an alkylated polyethylene oxide, an alkylated cellulose, an alkylated polyvinyl alcohol, an alkyl carboxylic acid, an aryl carboxylic acid, a sulfate salt and an ammonium salt.

12. The abrasive composition according to claim 1, wherein the slurry further comprises at least one of inorganic abrasive particles and polymeric abrasive particles.

13. The abrasive composition according to claim 12, wherein the slurry further comprises polymeric abrasive particles and said polymeric abrasive particles are formed by combining a substituted or unsubstituted formaldehyde, and at least one of (a) a substituted or unsubstituted melamine, (b) a substituted or unsubstituted urea, (c) a substituted or unsubstituted phenol and (d) a substituted or unsubstituted resorcinol.

14. The abrasive composition according to claim 12, wherein the slurry further comprises inorganic abrasive particles which are at least one selected from the group consisting of $SiO_2$, $Al_2O_3$, $ZrO_2$, $CeO_2$, SiC, $Fe_2O_3$, $TiO_2$, $Si_3N_4$ and diamond.

15. The abrasive composition according to claim 1, wherein the passivation agent is at least one selected from the group consisting of benzotriazole, benzothiazole, 1 H-benzotriazoleacetonitrile, benzotriazole-5-carboxylic acid, 2(3H)-benzothiazolone, and 1 H-benzotriazole-1-methanol.

16. A chemical mechanical planarization process, which comprises:
    planarizing a surface of a semiconductor with a chemical mechanical planarization abrasive slurry composition which comprises non-polymeric organic particles as an abrasive material, 0.1–10 w/w % of an oxidizing agent and a solvent.

17. The chemical mechanical planarization process of claim 16, wherein the solvent is soft water, the non-polymeric organic particles are present in a concentration of 0.001–20 w/w %, and the slurry further comprises 0.05–10 w/w % of a chelating agent, 0.01–10 w/w % of a surfactant, and 0–10 w/w % of a passivation agent.

18. The chemical mechanical planarization process of claim 16, wherein the composition of the surface of the semiconductor comprises copper and the slurry further comprises inorganic abrasive particles.

19. The chemical mechanical planarization process of claim 16, further comprising a preliminary step of reducing the size of the abrasive non-polymeric organic particles in the presence of an anionic surfactant prior to combining the abrasive non-polymeric organic particles in the chemical mechanical planarization abrasive slurry composition.

* * * * *